(12) United States Patent
Fang et al.

(10) Patent No.: US 12,387,862 B2
(45) Date of Patent: Aug. 12, 2025

(54) ELECTRONIC LOCK

(71) Applicant: TONG LUNG METAL INDUSTRY CO., LTD., Chiayi County (TW)

(72) Inventors: Chun-Yi Fang, Yunlin County (TW); Pai-Hsiang Chuang, New Taipei (TW); Ding-Sian Cai, Chiayi County (TW); Jui-Chieh Cheng, Chiayi County (TW)

(73) Assignee: TONG LUNG METAL INDUSTRY CO., LTD., Chiayi County (TW)

( * ) Notice: Subject to any disclaimer, the term of this patent is extended or adjusted under 35 U.S.C. 154(b) by 347 days.

(21) Appl. No.: 18/097,817

(22) Filed: Jan. 17, 2023

(65) Prior Publication Data

US 2023/0230740 A1 Jul. 20, 2023

(30) Foreign Application Priority Data

Jan. 18, 2022 (TW) .................................. 111200621

(51) Int. Cl.
| | | |
|---|---|---|
| *H01F 7/08* | (2006.01) | |
| *G06F 3/01* | (2006.01) | |
| *H03K 17/96* | (2006.01) | |

(52) U.S. Cl.
CPC ............ *H01F 7/081* (2013.01); *G06F 3/016* (2013.01); *H03K 17/9618* (2013.01)

(58) Field of Classification Search
CPC ............................ H01F 7/081; H03K 17/9618
See application file for complete search history.

(56) References Cited

U.S. PATENT DOCUMENTS

| | | | | |
|---|---|---|---|---|
| 5,475,996 A | * | 12/1995 | Chen ................... | E05B 47/0692 70/279.1 |
| 2005/0261019 A1 | * | 11/2005 | Lee ...................... | H05K 9/0067 455/90.3 |
| 2006/0153416 A1 | * | 7/2006 | Kaneda ................. | H04R 9/02 381/396 |

* cited by examiner

*Primary Examiner* — Quan Zhen Wang
*Assistant Examiner* — Mancil Littlejohn, Jr.
(74) *Attorney, Agent, or Firm* — MUNCY, GEISSLER, OLDS & LOWE, P.C.

(57) ABSTRACT

An electronic lock capable of offering haptic feedback includes an input panel, a circuit board, at least one inductor member, at least one magnetic member, and at least one diaphragm that abuts against the circuit board. The at least one inductor member is electrically coupled to the circuit board, is connected to the at least one diaphragm, and is adjacent to the at least one magnetic member. When the input panel is pushed toward the circuit board, the circuit board and the at least one inductor member are conducted, and the circuit board alternately distributes electric currents ire different directions to the at least one inductor member such that the at least one magnetic member alternately, attracts and pushes the at least one inductor member, thereby urging the at least one diaphragm to vibrate upon movement of the at east one inductor member.

9 Claims, 5 Drawing Sheets

ELECTRONIC LOCK

CROSS-REFERENCE TO RELATED APPLICATION

This application claims priority to Taiwanese Utility Model Patent Application No. 111200621, filed on Jan. 18, 2022.

FIELD

The disclosure relates to an electronic lock, and more particularly to an electronic lock that generates operation feedback.

BACKGROUND

According to a conventional touch panel disclosed in Taiwanese Patent No. TWI730825, the conventional touch panel uses thin-film technology and may be adopted in an electronic lock. However, when a user operates the electronic lock having the conventional touch panel, the user may not know for certain if he/she is touching the right key on the conventional touch panel.

SUMMARY

Therefore, an object of the disclosure is to provide an electronic lock that can achieve at least one more effect than the prior art.

According to the disclosure, the electronic lock includes a housing, an input panel, a circuit board, at least one diaphragm, at least one inductor member, a fastening seat and at least one magnetic member. The input panel is mounted to and exposed from the housing, and has a plurality of key displaying areas at one side thereof. The circuit board is disposed in the housing and abuts against the input panel: The at least one diaphragm is disposed in the housing and abuts against the circuit board. The at least one inductor member is disposed in the housing, is electrically coupled to the circuit board, and is connected to the at least one diaphragm. The fastening seat is disposed in the housing. The at least one magnetic member is fixedly mounted to the fastening seat and is adjacent to the at least one inductor member. When one of the key displaying areas of the input panel is pushed toward the circuit board, the circuit board and the at least one inductor member are conducted and the circuit board alternately distributes electric currents in different directions to the at least one inductor member such that the at least one magnetic member alternately attracts and pushes the at least one inductor member, thereby urging the at least one diaphragm to vibrate upon movement of the at least one inductor member.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
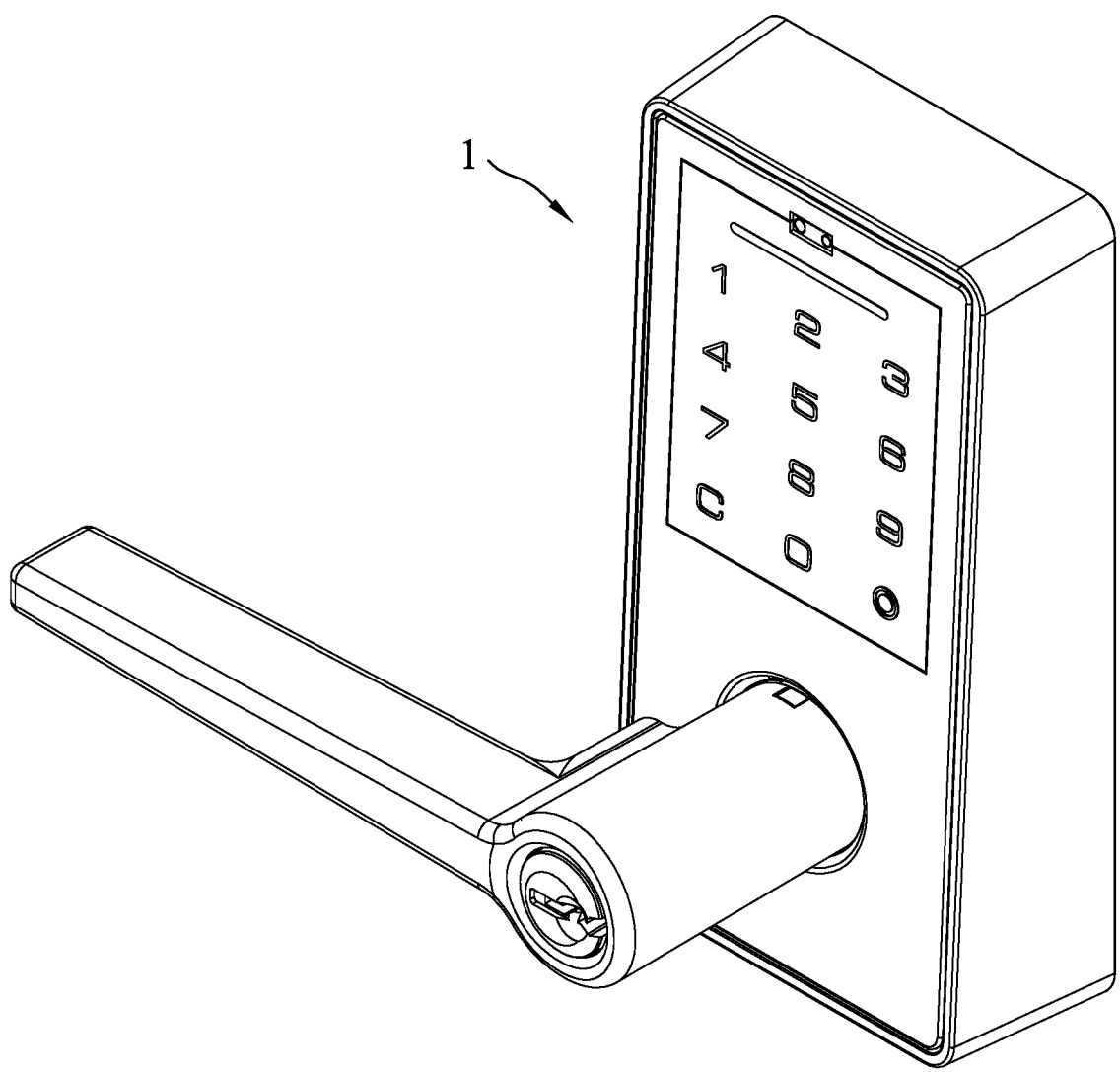
FIG. 1 is a perspective view of an embodiment of an electronic lock that offers haptic feedback according to the disclosure.
Figure 2:
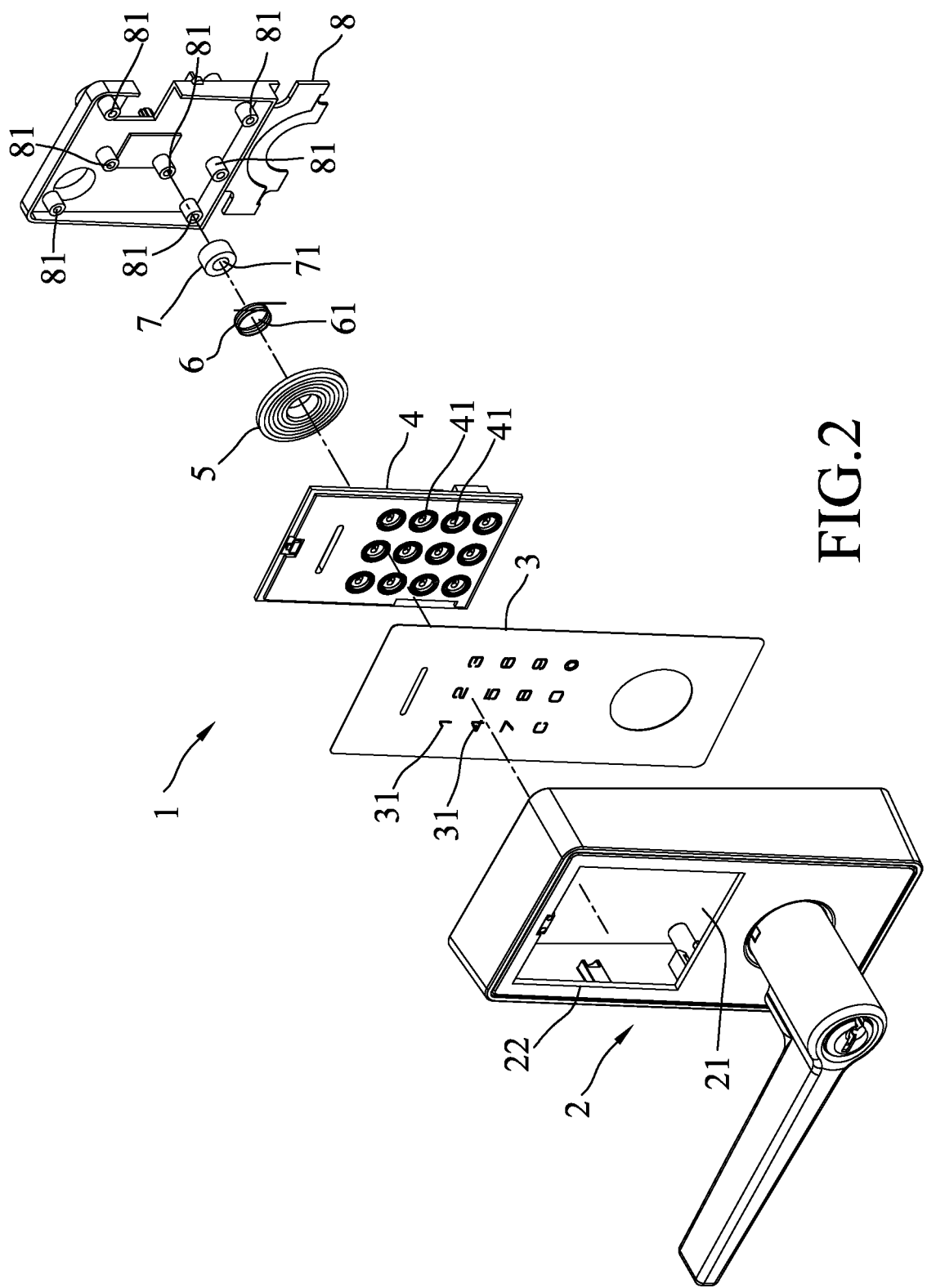
FIG. 2 is an exploded perspective view of the embodiment.
Figure 3:
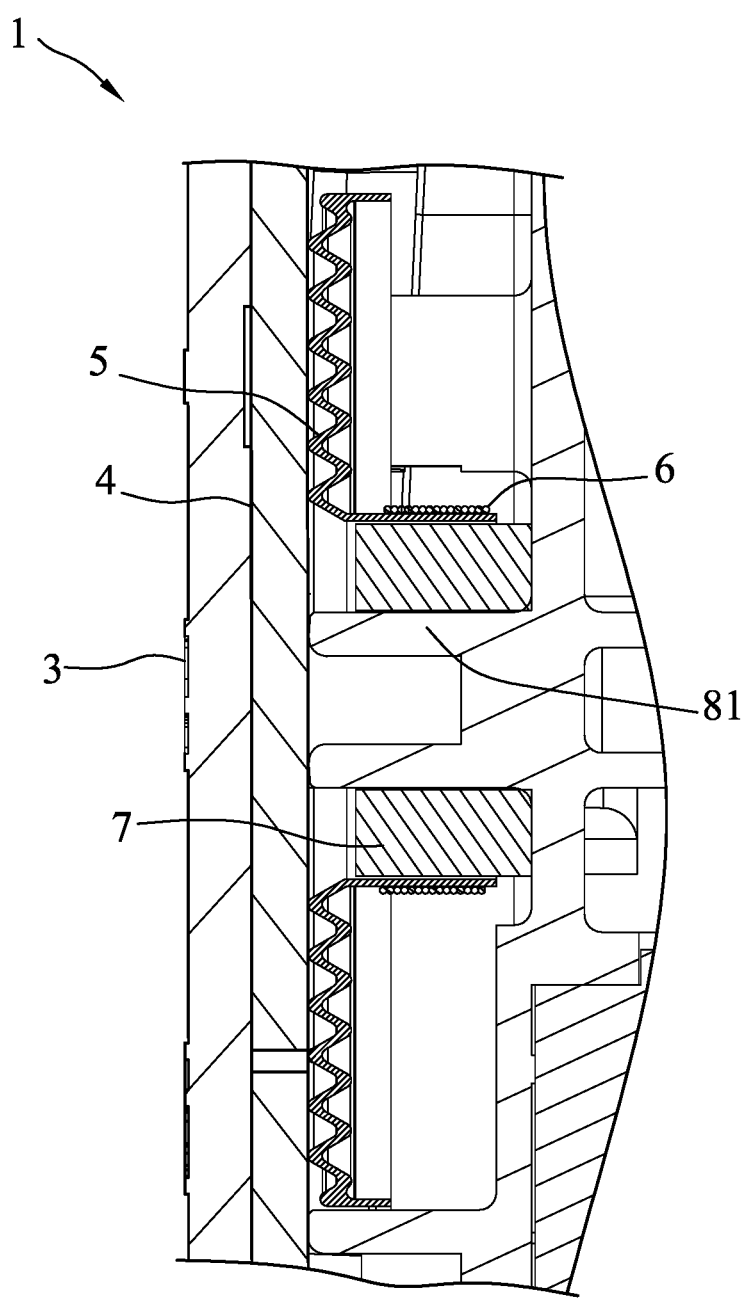
FIG. 3 is a fragmentary sectional view of the embodiment.
Figure 4:
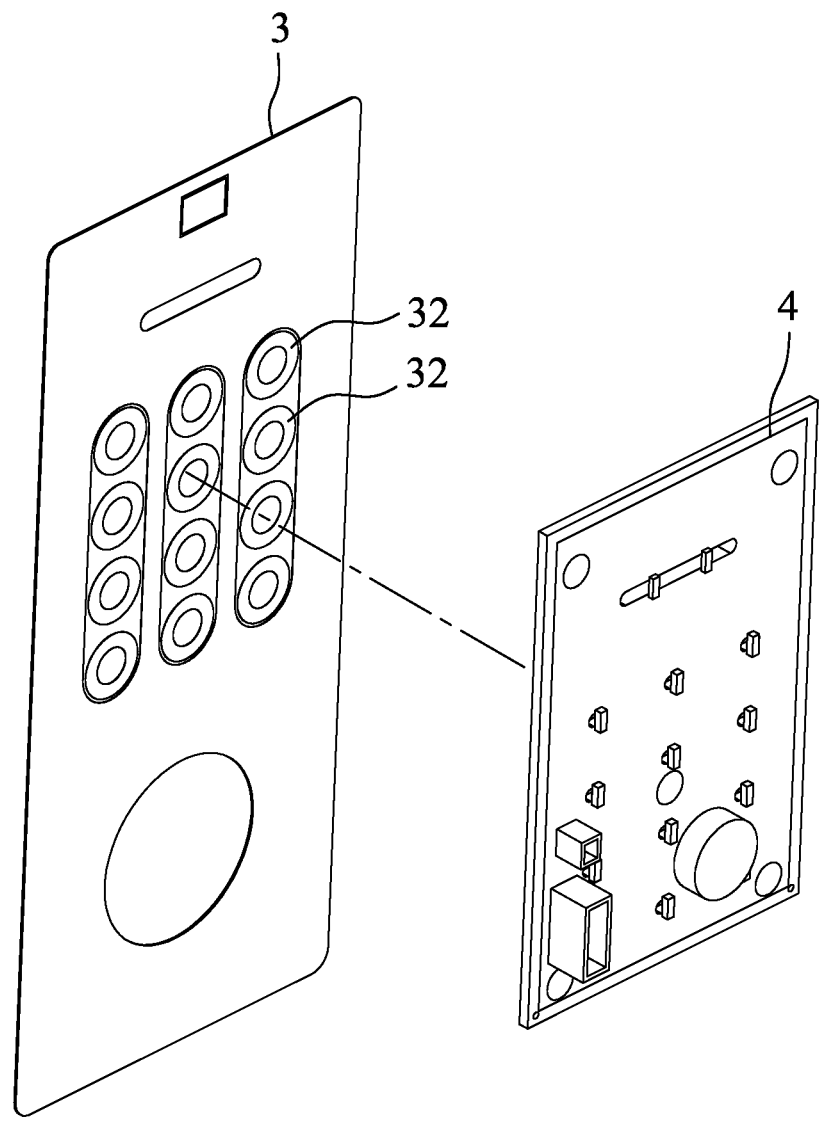
FIG. 4 is a perspective view illustrating an input panel and a circuit board of the embodiment.
Figure 5:
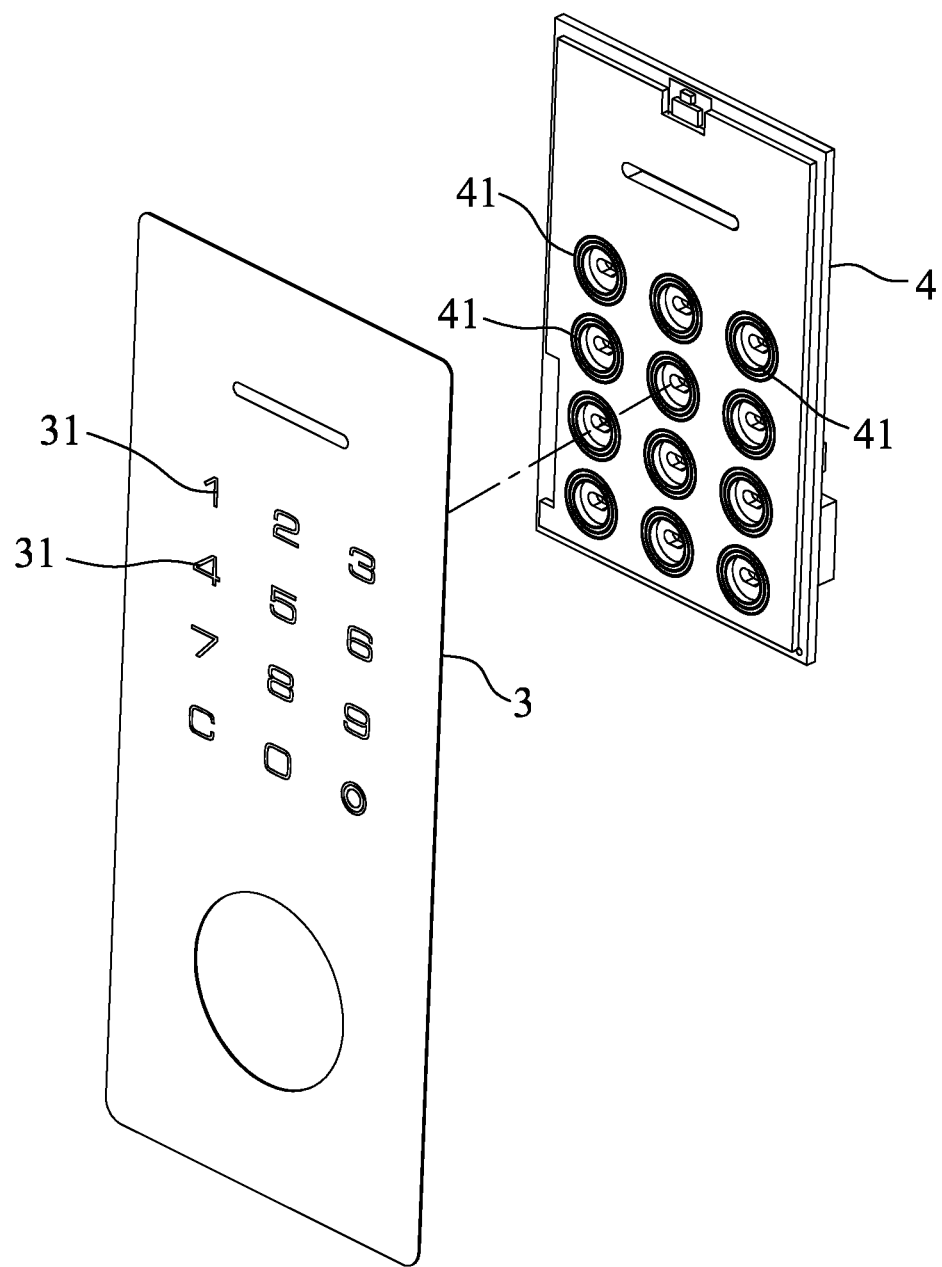
FIG. 5 is another perspective view illustrating the input panel and the circuit board.

Referring to FIG. 1 to FIG. 3, an embodiment of an electronic lock according to the disclosure is capable of offering haptic feedback. The electronic lock includes a housing 2, an input panel 3, a circuit board 4, a diaphragm 5, an inductor member 6, a magnetic member 7 and a fastening seat 8.

The housing 2 has a chamber 21 and a window opening 22. The chamber 21 is in spatial communication with the window opening 22, in this embodiment, the input panel 3 adopts thin-film technology. However, in one embodiment, the input panel 3 may be configured to be a common touch panel. The input panel 3 has a plurality of key displaying areas 31 that are at one side thereof, and a plurality of conductive layers 32 that are located at another side thereof opposite to the one side thereof, and that respectively correspond in position to the key displaying areas 31. The input panel 3 is mounted to the housing 2, is located in the chamber 21, and the key displaying areas 31 thereof is exposed from the window opening 22. The circuit board 4 is disposed in the chamber 21, abuts against the input panel 3, and includes a plurality of key circuits 41 that respectively correspond in position to the key displaying areas 31. Specifically, in this embodiment, the circuit board 4 abuts against the another side of the input panel 3, and each of the conductive layers 32 is located between the respective one of the key displaying areas 31 and a respective one of the key circuits 41, and is spaced apart from the respective one of the key circuits 41. In one embodiment, the circuit board 4 and the input panel 3 may be laminated together.

The diaphragm 5 is disposed in the chamber 21, abuts against the circuit board 4, and is configured to be made of one of a metal material, a fiber material and a plastic material, in this embodiment, the diaphragm 5 is located at one side of the circuit board 4 opposite to the input panel 3. The inductor member 6 is disposed in the chamber 21, is electrically coupled to the circuit board 4, and defines a through hole 61. In this embodiment, the inductor member 6 is configured to be a coil, and the inductor member 6 and the diaphragm 5 are connected so that the inductor member 6 and the diaphragm 5 may move together. In certain embodiments, the diaphragm 5 may be integrally formed with the inductor member 6. The fastening seat 8 is disposed in the chamber 21, and includes a plurality of mounting rods 81. The magnetic member 7 is sleeved on lid and fixedly mounted to one of the mounting rods 81, and is located in the through hole 61 of the inductor member 6 such that the magnetic member 7 is adjacent to the inductor member 6. In this embodiment, the magnetic member 7 has a mounting hole 71, and the one of the mounting rods 81 extends through the mounting hole 71. The input panel 3, the circuit board 4, the diaphragm 5, the inductor member 6 and the magnetic member 7 are positioned in the chamber 21 of the housing 2 via the fastening seat 8.

When one of the key displaying areas 31 is pushed toward the circuit board 4 by a user, the one of the key displaying areas 31 is resiliently deformed and urges the respective one of the conductive layers 32 to abut against the respective one of the key circuits 41 such that the respective one of the conductive layers 32 is electrically coupled to the respective one of the key circuits 41, and that the circuit board 4 generates an input signal accordingly. When the respective one of the conductive layers 32 is electrically coupled to the respective one of the key circuits 41, the circuit board 4 is conducted to the inductor member 6 and alternately distributes electric currents in different directions to the inductor member 6 such that the magnetic member 7 alternately attracts and pushes the inductor member 6 via changes in the direction of a lid magnetic field of the inductor member 6, thereby urging the diaphragm 5 to vibrate upon movement of the inductor member 6. Specifically, because the magnetic member 7 is fixedly mounted to the one of the mounting rods 81, when the inductor member 6 and the magnetic member 7 are attracted to each other or push each other away via the changes in the direction of the magnetic field, only the inductor member 6 will move/vibrate. In addition, because the diaphragm 5 and the inductor member 6 are connected, the diaphragm 5 moves/vibrates with the inductor member 6. Therefore, by virtue of the diaphragm 5 abutting against the circuit board 4, and by virtue of the circuit board 4 abutting against the input panel 3, the user may receive haptic feedback generated by the diaphragm 5 and the inductor member 6 when the user operates the input panel 3 (e.g., pressing one of the key displaying areas 31). Furthermore, amplitude of the movement of the inductor member 6 varies with intensity of the electric currents in the inductor member 6, and frequency of the movement of the inductor member 6 varies with a rate at which the circuit board 4 alternately distributes the electric currents in the different directions to the inductor member 6. Thus, the amplitude and the frequency of the movement of the inductor member 6 are adjustable (i.e., the haptic feedback offered by the electronic lock is adjustable).

In this embodiment, the electronic lock includes one diaphragm 5, one inductor member 6 and one magnetic member 7, and the diaphragm 5, the inductor member 6 and the magnetic member 6 are adjacent to a center of the circuit board 4. However, in one embodiment, the electronic lock may include a plurality of diaphragms, a plurality of the inductor members, and a plurality of the magnetic members, and the diaphragms, the inductor members and the magnetic members may not be adjacent to the center of the circuit board 4. For example, in one embodiment, the electronic lock may include four diaphragms that are respectively adjacent to four corners of the circuit board 4, four inductor members that are respectively adjacent to the four corners of the circuit board 4, and four magnetic members that are respectively adjacent to the four corners of the circuit board 4. There will be no further description on the diaphragms, the inductor members and the magnetic members since each of the diaphragms has the same function and achieves the same effect as the diaphragm 5 in this embodiment, each of the inductor members has the same function and achieves the same effect as the inductor member 6 in this embodiment, and each of the magnetic members has the same function and achieves the same effect as the magnetic member 7 in this embodiment.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one lid embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic lock capable of offering haptic feedback, the electronic lock comprising: a housing; an input panel mounted to and exposed from the housing, and having a front surface and a plurality of key displaying areas-on the front surface;
    a circuit board disposed in the housing and abutting against the input panel; at least one diaphragm disposed in the housing and in parallel to the front surface of the input panel and abutting against the circuit board; at least one inductor member disposed in the housing, electrically coupled to the circuit board, and connected to the at least one diaphragm;
    a fastening seat disposed in the housing; and
    at least one magnetic member fixedly mounted to the fastening seat and adjacent to the at least one inductor member;
    wherein, when one of the key displaying areas of the input panel is pushed toward the circuit board, the circuit board and the at least one inductor member are conducted and the circuit board alternately distributes electric currents in different directions to the at least one inductor member such that the at least one magnetic member alternately attracts and pushes the at least one inductor member in a direction perpendicular to the surface of the input panel, thereby urging the at least one diaphragm to move in the direction perpendicular to the surface of the input panel to generate vibration upon movement of the at least one inductor member.

2. The electronic lock as claimed in claim 1, wherein the at least one inductor member defines a through hole, the fastening seat including at least one mounting rod, the magnetic member being sleeved on and fixedly mounted to the at least one mounting rod, and being located in the through hole of the at least one inductor member.

3. The electronic lock as claimed in claim 1, wherein the input panel adopts thin-film technology.

4. The electronic lock as claimed in claim 1, wherein the at least one diaphragm is configured to be made of one of a metal material, a fiber material and a plastic material.

5. The electronic lock as claimed in claim 1, wherein the at least one inductor member is configured to be a coil.

6. The electronic lock as claimed in claim 1, wherein the at least one diaphragm is integrally formed with the at least one inductor member.

7. The electronic lock as claimed in claim 1, wherein the input panel includes a plurality of conductive layers that are located at another side thereof opposite to the one side thereof and that respectively correspond in position to the key displaying areas, the circuit board including a plurality of key circuits that respectively correspond in position to the key displaying areas, when the one of the key displaying areas is pushed toward the circuit board, a respective one of the conductive layers being urged to abut against a respective one of the key circuits such that the respective one of the conductive layers is electrically coupled to the respective one of the key circuits, and that the circuit board generates an input signal accordingly, the circuit board being conducted to the at least one inductor member and alternately distributing the electric currents to the at least one inductor member in the different directions when one of the key circuits thereof is electrically coupled to the respective one of the conductive layers.

8. The electronic lock as claimed in claim 1, wherein amplitude of the movement of the at least one inductor member varies with intensity of the electric currents in the at least one inductor member.

9. The electronic lock as claimed in claim 1, wherein frequency of the movement of the at least one inductor member varies with a rate at which the circuit board alternately distributes the electric currents in the different directions to the at least one inductor member.

* * * * *